US011015970B2

(12) United States Patent
Waelde et al.

(10) Patent No.: US 11,015,970 B2
(45) Date of Patent: May 25, 2021

(54) RADAR LEVEL MEASUREMENT DEVICE COMPRISING SYNCHRONISATION SIGNALS ON DIFFERENT LINE TYPES

(71) Applicant: VEGA GRIESHABER KG, Wolfach (DE)

(72) Inventors: Steffen Waelde, Niedereschach (DE); Roland Welle, Hausach (DE)

(73) Assignee: VEGA GRIESHABER KG, Wolfach (DE)

( * ) Notice: Subject to any disclaimer, the term of this patent is extended or adjusted under 35 U.S.C. 154(b) by 0 days.

(21) Appl. No.: 16/339,071

(22) PCT Filed: Sep. 25, 2018

(86) PCT No.: PCT/EP2018/075890
§ 371 (c)(1),
(2) Date: Apr. 3, 2019

(87) PCT Pub. No.: WO2019/068504
PCT Pub. Date: Apr. 11, 2019

(65) Prior Publication Data
US 2020/0386601 A1    Dec. 10, 2020

(30) Foreign Application Priority Data

Oct. 6, 2017 (DE) ..................... 10 2017 217 805.1

(51) Int. Cl.
*G01F 23/284* (2006.01)
*G01S 7/03* (2006.01)
(Continued)

(52) U.S. Cl.
CPC ............ *G01F 23/284* (2013.01); *G01S 7/032* (2013.01); *G01S 13/426* (2013.01); *G01S 13/87* (2013.01);
(Continued)

(58) Field of Classification Search
CPC .... G01F 23/284; G01F 22/00; G01F 23/0076; H01Q 1/225; H01Q 1/2283; H01Q 23/00;
(Continued)

(56) References Cited

U.S. PATENT DOCUMENTS 8,040,274 B2 * 10/2011 Wendler ................ G01F 23/284
342/124
9,726,756 B2 * 8/2017 Jansen .................... G01S 13/87
(Continued)

FOREIGN PATENT DOCUMENTS

CN         1189217 A      7/1998
CN       101438458 A      5/2009
(Continued)

OTHER PUBLICATIONS

International Search Report dated Dec. 4, 2018, in PCT/EP2018/075890 filed on Sep. 25, 2018 ( with Translation of Category of Cited Documents in attached foreign language Search Report).
(Continued)

*Primary Examiner* — Olumide Ajibade Akonai
(74) *Attorney, Agent, or Firm* — Oblon, McClelland, Maier & Neustadt, L.L.P.

(57) ABSTRACT

A radar level measurement device for level measurement or for determining a topology of a filling material surface in a container is provided, including a first radar chip and a second radar chip, the first radar chip including a first synchronisation circuit configured to generate a radio-frequency signal, and the second radar chip including a second synchronisation circuit; and a radio-frequency line assembly configured to transmit the radio-frequency signal from the first synchronisation circuit to the second synchronisation circuit to synchronise the first and the second radar chips, the radio-frequency line assembly including two or more different line types arranged in series with one another.

13 Claims, 19 Drawing Sheets

(51) Int. Cl.
| | |
|---|---|
| *G01S 13/42* | (2006.01) |
| *G01S 13/87* | (2006.01) |
| *G01S 13/89* | (2006.01) |
| *H01P 5/08* | (2006.01) |
| *H05K 1/02* | (2006.01) |
| *G01S 13/34* | (2006.01) |
| *H01Q 1/22* | (2006.01) |

(52) U.S. Cl.
CPC ............... *G01S 13/89* (2013.01); *H01P 5/08* (2013.01); *H05K 1/0243* (2013.01); *G01S 13/343* (2013.01); *H01Q 1/225* (2013.01); *H05K 2201/10098* (2013.01)

(58) Field of Classification Search
CPC ........... H01L 2924/18162; G01S 7/032; G01S 7/352; G01S 13/88; G01S 7/35; G01S 13/87; G01S 7/03
See application file for complete search history.

(56) References Cited

U.S. PATENT DOCUMENTS

| | | | |
|---|---|---|---|
| 2005/0179584 A1* | 8/2005 | Ohlsson | G01S 13/24 342/124 |
| 2007/0279309 A1 | 12/2007 | Schultheiss et al. | |
| 2009/0251362 A1* | 10/2009 | Margomenos | G01S 13/931 342/175 |
| 2012/0154203 A1* | 6/2012 | Vacanti | G01S 13/44 342/149 |
| 2015/0061781 A1 | 3/2015 | Shimura | |
| 2015/0253175 A1* | 9/2015 | Jirskog | G01S 13/343 342/58 |
| 2015/0338261 A1* | 11/2015 | Mueller | G01S 13/34 342/124 |
| 2016/0245898 A1 | 8/2016 | Li et al. | |
| 2016/0301125 A1* | 10/2016 | Kim | H01Q 1/243 |
| 2017/0090015 A1* | 3/2017 | Breen | G01S 7/032 |
| 2017/0141453 A1 | 5/2017 | Waelde et al. | |
| 2017/0315214 A1* | 11/2017 | Steinbuch | G01S 7/4008 |
| 2018/0088221 A1* | 3/2018 | Yomo | G01S 13/878 |
| 2018/0115409 A1* | 4/2018 | Nayyar | G01S 13/343 |
| 2018/0156890 A1 | 6/2018 | Li et al. | |
| 2018/0287264 A1 | 10/2018 | Waelde et al. | |
| 2019/0049554 A1* | 2/2019 | Parrini | G01S 7/032 |

FOREIGN PATENT DOCUMENTS

| | | |
|---|---|---|
| CN | 102404754 A | 4/2012 |
| CN | 204539122 U | 8/2015 |
| CN | 105721094 A | 6/2016 |
| CN | 106199530 A | 12/2016 |
| CN | 107070468 A | 8/2017 |
| DE | 10 2014 014 307 A1 | 3/2016 |
| DE | 10 2016 101 318 A1 | 8/2016 |
| DE | 10 2015 219 612 A1 | 4/2017 |
| EP | 3 171 138 A1 | 5/2017 |
| WO | WO 2007/124860 A1 | 11/2007 |
| WO | WO 2016/202394 A1 | 12/2016 |

OTHER PUBLICATIONS

German Office Action dated Nov. 13, 2018, in DE 10 2017 217 805.1 filed on Oct. 6, 2017.
Combined Chinese Office Action and Search Report dated Dec. 10, 2019 in corresponding Chinese Patent Application No. 201880004910.3 (with English Translation of Category of Cited Documents), 10 pages.

\* cited by examiner

RADAR LEVEL MEASUREMENT DEVICE COMPRISING SYNCHRONISATION SIGNALS ON DIFFERENT LINE TYPES

FIELD OF THE INVENTION

The invention relates to level measurement and to the determination of the topology of a filling material surface in a container. The invention relates in particular to a radar level measurement device for level measurement or for determining the topology of a filling material surface in a container.

BACKGROUND

Nowadays, radar level measurement devices are used for level measurement and for determining the topology of a filling material surface. In contrast to a number of other fields, the breakthrough for radar technology in level measurement was possible only once extremely small reflection signals could be detected and processed by the electronics of the measurement devices.

Modern level measurement devices and topology measurement devices that are capable of determining the exact shape of the surface of a filling material are characterised not only by a high transmission frequency that is typically in the gigahertz range, for example in the range of from 75 GHz to 85 GHz, but are also capable of reliably processing amplitude differences of the reflected signal in a range of up to 100 dB.

In order to generate and process the radio-frequency transmission signals in the range of 79 GHz, a monolithic microwave integrated circuit (MMIC) may be provided. This component may comprise a plurality of transmit and receive channels which are also referred to, in this application, as radar channels, as a result of which the filling material surface can be scanned.

The more precisely the filling material surface is intended to be scanned, the more transmit and receive channels are required in order to achieve high-quality imaging, which is associated with a correspondingly high outlay for hardware and a correspondingly high energy requirement.

SUMMARY OF THE INVENTION

An object of the invention is that of providing a radar level measurement device for measuring a filling level of a medium or the topology of a medium in a container.

This object is achieved by the subject matter of the independent claim. Developments of the invention can be found in the dependent claims and in the following description.

A first aspect of the invention relates to a radar level measurement device that is designed for measuring a filling level of a medium in a container, and/or for determining the topology of a filling material surface in the container. The radar level measurement device comprises a first radar chip and at least one second radar chip. Both the first radar chip and the second radar chip comprise one or more transmit channels for in each case emitting a transmission signal towards the filling material surface, and one or more receive channels for receiving the transmission signals that are reflected on the filling material surface. One or more of the transmit channels may also be designed as a combined transceiver channel.

The radar chips may in particular be microwave integrated circuits, which can also be referred to as a radar system-on-chip. A radar system-on-chip (RSoC) of this kind is a highly integrated microwave circuit comprising circuit components for digital functions, which radar system is capable, according to an embodiment, of integrating the entire functionality of a conventional radar system for signal generation, signal processing and transferring the received signals, i.e. the reflected transmission signals, into a digital representation, onto just one radar chip.

Each of the transmit channels may be designed to generate a radio-frequency transmission signal having a frequency in the gigahertz range, for example in the range of from 75 GHz to 85 GHz, or above.

The first radar chip comprises a first synchronisation circuit which is designed for generating a radio-frequency signal, which is generally a local oscillator signal of the radar chip. The radio-frequency signal may for example be a frequency-divided signal which therefore has a lower frequency than the transmission signal emitted by the radar level measurement device. For example, the radio-frequency signal has a frequency of 40 GHz or 20 GHz.

The second radar chip comprises a second synchronisation circuit, and a radio-frequency line assembly is provided which is designed for transmitting the radio-frequency signal from the first synchronisation circuit to the second synchronisation circuit, and which is provided for synchronising the two radar chips. The frequency division of the radio-frequency signal makes it possible to simplify the guidance of the conductive tracks because the power dissipation is reduced. It may be possible for the radio-frequency signal to be multiplied again before being used to synchronise the two radar chips, for example by means of a frequency multiplier that is arranged in the second synchronisation circuit.

The radio-frequency line assembly for transmitting the radio-frequency signal comprises two or more different line types which are arranged so as to be in series with one another, at least in part.

The radio-frequency line assembly for example comprises a microstrip line and a waveguide, for example a rectangular waveguide or a circular waveguide, a coaxial conductor, a waveguide that is integrated in a substrate (substrate integrate waveguide; SIW), and/or a coplanar waveguide. Other planar line types may also be provided.

Changing from one line type to another line type makes it possible to further reduce the power dissipation, because the second line type attenuates the radio-frequency signal to a lesser extent.

The radio-frequency line assembly may furthermore comprise a waveguide coupling for coupling the radio-frequency signal from the first line type into a waveguide (second line type).

The radio-frequency line assembly is for example split using one or more radio-frequency power dividers in order to synchronise a plurality of radar chips.

It may be possible for the two lines that proceed from the radio-frequency power divider and lead to the second synchronisation circuit of two further radar chips to have the same signal propagation delay as that required by the split radio-frequency signal for reaching the corresponding synchronisation circuit of the corresponding radar chip.

Furthermore, a radio-frequency amplifier (or a plurality thereof) may be provided, which amplifier is arranged in the radio-frequency line assembly and is designed for amplifying the radio-frequency signal.

The first radar chip may be designed as what is known as a master chip, which generates a synchronisation signal by means of which the further radar chip or chips, which is/are referred to as a slave chip or slave chips, are synchronised.

According to a further embodiment of the invention, the radio-frequency signal is a radio-frequency signal that is divided by a whole-number factor with respect to the transmission signal.

It may also be possible for the amplifier power of the radio-frequency amplifier or radio-frequency amplifiers arranged in the radio-frequency line assembly to be adjusted depending on the filling level and/or for example depending on the number of radar chips currently being used for the level measurement.

According to a further embodiment of the invention, the radio-frequency amplifier has a useful frequency range of 20 GHz or of 40 GHz.

According to a further embodiment of the invention, an analogue-to-digital converter is integrated on the first and/or the second radar chip in each case, which converter is designed to convert the received signal into a digitised intermediate frequency signal which can be traced back to one or more transmission signals reflected at the filling material surface.

According to a further embodiment of the invention, at least two of the transmit channels in each case comprise an antenna that is connected thereto.

According to a further embodiment of the invention, the radar level measurement device is designed as an FMCW radar level measurement device which uses a frequency-modulated continuous-wave signal for the purpose of measurement, each measuring cycle comprising a frequency sweep that has for example a starting frequency of 75 GHz and a maximum frequency of 85 GHz.

According to a further embodiment, the radio-frequency line assembly comprises a first conductive track on a printed circuit board, a second conductive track on the printed circuit board, and a waveguide that is arranged therebetween.

The radio-frequency line assembly may furthermore comprise vias which are guided through the printed circuit board and are used for changing the printed circuit board surface, such that parts of the radio-frequency line assembly are attached to one side of the printed circuit board and other parts of the radio-frequency line assembly are attached to the other, opposite, side.

According to a further embodiment of the invention, the radar level measurement device is designed for determining the topology of a medium in a container.

According to a further embodiment of the invention, the first and the second radar chip are each based on BiCMOS technology. According to a further embodiment of the invention, the radar chips are based on SiGe technology.

According to a further embodiment of the invention, the radar chips are based on RF CMOS technology and comprise radio-frequency circuit parts for frequencies of 75 GHz and above.

According to a further embodiment of the invention, the radio-frequency amplifier is a low noise amplifier (LNA) comprising a separate voltage supply.

According to an embodiment of the invention, the radio-frequency amplifier is operated exclusively in the linear range thereof. It is optionally possible for a plurality of radio-frequency amplifiers to be provided in the radio-frequency line assembly.

Embodiments of the invention will be described in the following with reference to the drawings. If the same reference signs are used in the following description of the drawings, said reference signs denote identical or similar elements. The drawings are schematic and not to scale.

DETAILED DESCRIPTION OF EMBODIMENTS

Highly integrated radar chips (RSoCs, radar system-on-chips) 301 may comprise a plurality of transmitters and receivers. Said chips may be used in fields such as driver assistance systems, traffic surveillance, object surveillance in industrial facilities, drones, and many further fields.

The advantage of multi-channel radar chips 301 is that a type of beamforming can be carried out. The conventional radar devices for the above applications sometimes require from one to four radar chips 301 in order to meet the requirements.

Fields of application for said RSoCs 301 are also found in level measurement. Level measurement devices 101 that determine the topology of a filling material surface 107 can scan the surface of bulk materials in order to thereby obtain more information about the actual filling level and the volume thereof than could be obtained by means of a conventional level measurement.

In the case of level measurement, the problem arises that small beam angles are required even in the case of large distances, and this is associated with a large antenna aperture.

Figure 1A:
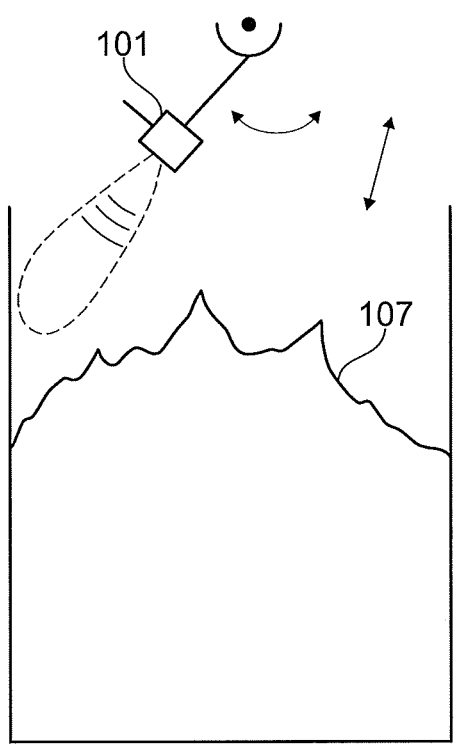
FIG. 1A shows a radar level measurement device that is installed in a container in order to determine the topology of the surface of a filling material in the container.
Figure 1B:
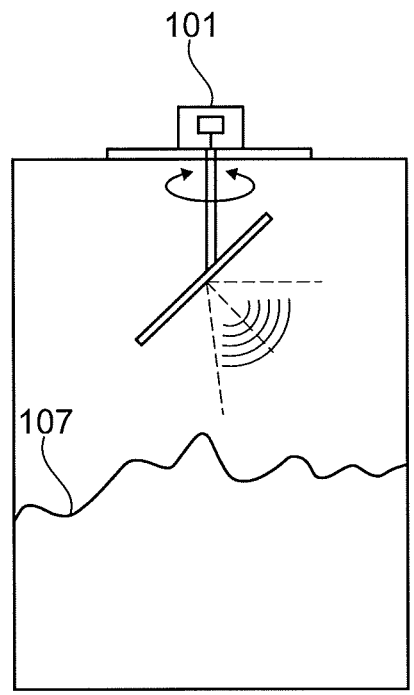
FIG. 1B shows a further radar level measurement device.
Figure 1C:
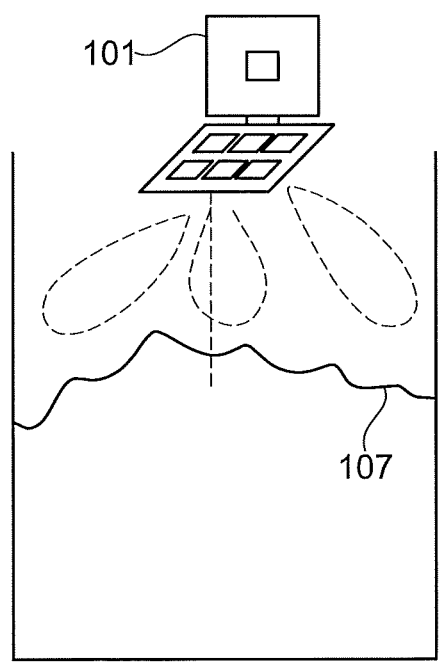
FIG. 1C shows a further radar level measurement device.

One option for achieving this is to mechanically pivot a single-channel radar device (FIG. 1A) in order to thus scan the surface. A further option is a semi-mechanical system (FIG. 1B). In this case, a combination of analogue and digital beamforming is combined with mechanical pivoting. Said systems have disadvantages in terms of robustness. Mechanical components often require maintenance when used under harsh process conditions and are expensive to produce. For this reason, fully electronic beamforming can also be carried out (FIG. 1C).

Figure 2:
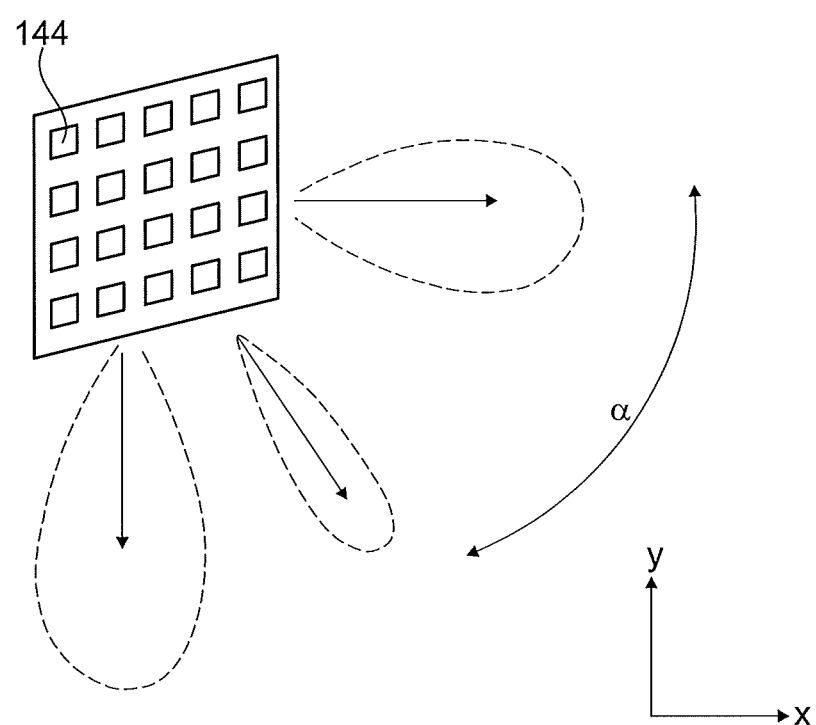
FIG. 2 shows an array antenna of a radar level measurement device.

In order to achieve antenna apertures of a comparable size using said beamforming radar systems, a large number of transmitters and receivers should be provided. A challenge in the case of fully electronic beamforming is that a plurality of antennas having relatively small individual apertures should be used. Furthermore, transmitters and receivers, which are usually each provided with an antenna element 144, 303, are intended to be aligned in two dimensions (x- and y-direction) (FIG. 2).

Therefore, topology-determining level measuring technology generally requires a plurality of transmitters and receivers, resulting in a number of chips that is greater than four.

The radar level measurement devices that determine the topology usually comprise a plurality of transmitting and receiving antennas. Systems of this kind are also known as MIMO systems (multiple input multiple output). Specific methods of digital beamforming make it possible to digitally influence the directivity of the transmitting and receiving array antennas both on the transmitting side and on the receiving side, as a result of which a filling material surface can be scanned. Said level measurement devices use a plurality of discrete radio-frequency components, such as mixers, low noise amplifiers, couplers, frequency multipliers, voltage-controlled oscillators, etc., and discrete analogue-to-digital converters, phase-locked loops, voltage controllers, filters, amplifiers and further low-frequency components for each transmit and receive channel. This characteristic often renders the MIMO systems complex, large and expensive.

In the case of highly integrated radar chips 301, a plurality of said above-mentioned components are already completely integrated onto one chip 301. The PLLs, VCOs, mixers, ADCs, filters, control units, SPI interfaces, amplifiers, switches and voltage controllers are already integrated. As a result, a great deal of space can be saved on a circuit board. Said chips 301 provide a further advantage with respect to costs, since said chips are cheaper than a discrete structure comprising a plurality of different individual components. The MIMO chips 301 have for example three transmitter and four receiver stages. A possible transmission frequency range may for example be between 55 and 65 GHz, or also between 75 and 85 GHz.

The radar chips 301 can be parametrised using a digital interface (comprising an associated bus 305) (SPI, I²C, etc.). Various parameters can be set or read out in order to adjust the modulation type, bandwidth, frequency range, sampling frequency, IF filter characteristics (intermediate frequency signal), etc. Generally, the analogue IF signals, which contain information relating to spacings and angles of objects from the surveillance region, are also digitised on the radar chip 301 for further signal processing.

The radar method according to which said radar chips 301 generally operate is a particular frequency-modulated continuous-wave radar method (FMCW method). However, during a measurement it is necessary to modulate not just one frequency ramp, but instead a plurality thereof in succession, which ramps have a fixed time reference with respect to one another. A possible number of ramps per measurement is for example 128. Said 128 ramps, combined, are referred to as a frame.

Expedient signal processing algorithms make it possible to also determine speeds of a plurality of objects, in addition to spacings thereof. The ramp duration is very short compared with the conventional FMCW method and is generally in the range of between 10 and 500 ns per ramp. Since the RF bandwidth of the transmission signals may be in the range of between several hundred megahertz and four (or more) gigahertz, the intermediate frequency signal has to be digitised at a high sampling rate.

The combination of the high RF bandwidth and short ramp durations results in a high sampling rate in the case of analogue-to-digital conversion.

The interface for the digitised output signals is usually a high-speed serial differential digital interface 304 such as LVDS or CSI2. In the case of the example of a radar chip 301 comprising four receive channels, the digital interface of the radar chip 301 comprises four LVDS or CSI2 interfaces, via which the digitised intermediate frequency signal is transmitted. In addition, said digital interfaces use an additional differential clock signal which is required at the receiver of the digitised data for the purpose of synchronising the interfaces. Depending on the interface, further signal lines are required in order to mark the start and/or end of the data packets.

Figure 3:
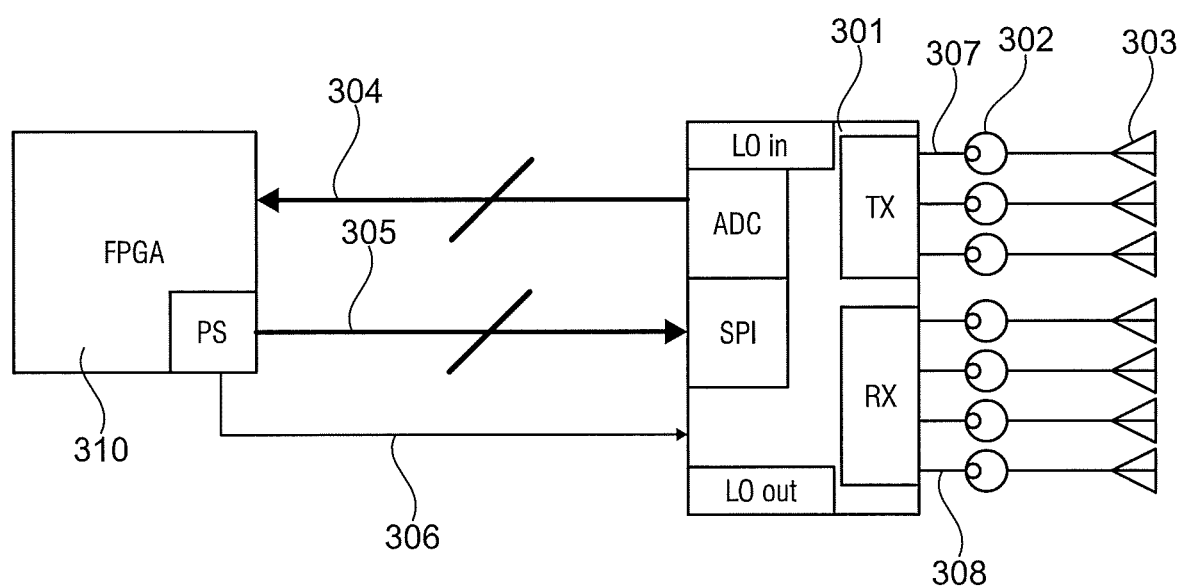
FIG. 3 shows the structure of a radar level measurement device comprising one radar chip.
Figure 4A:
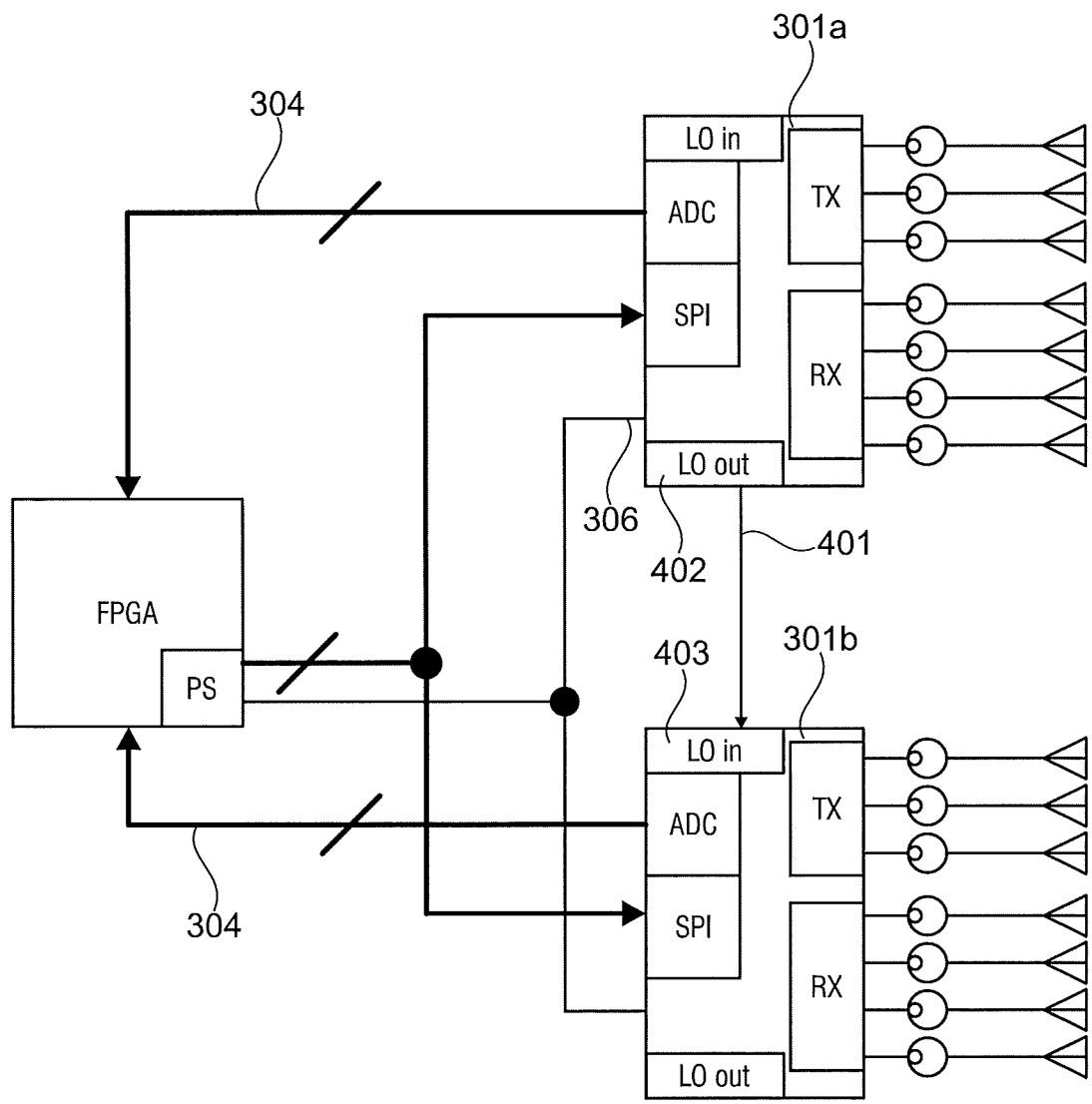
FIG. 4A shows the structure of a further radar level measurement device comprising two radar chips.
Figure 4B:
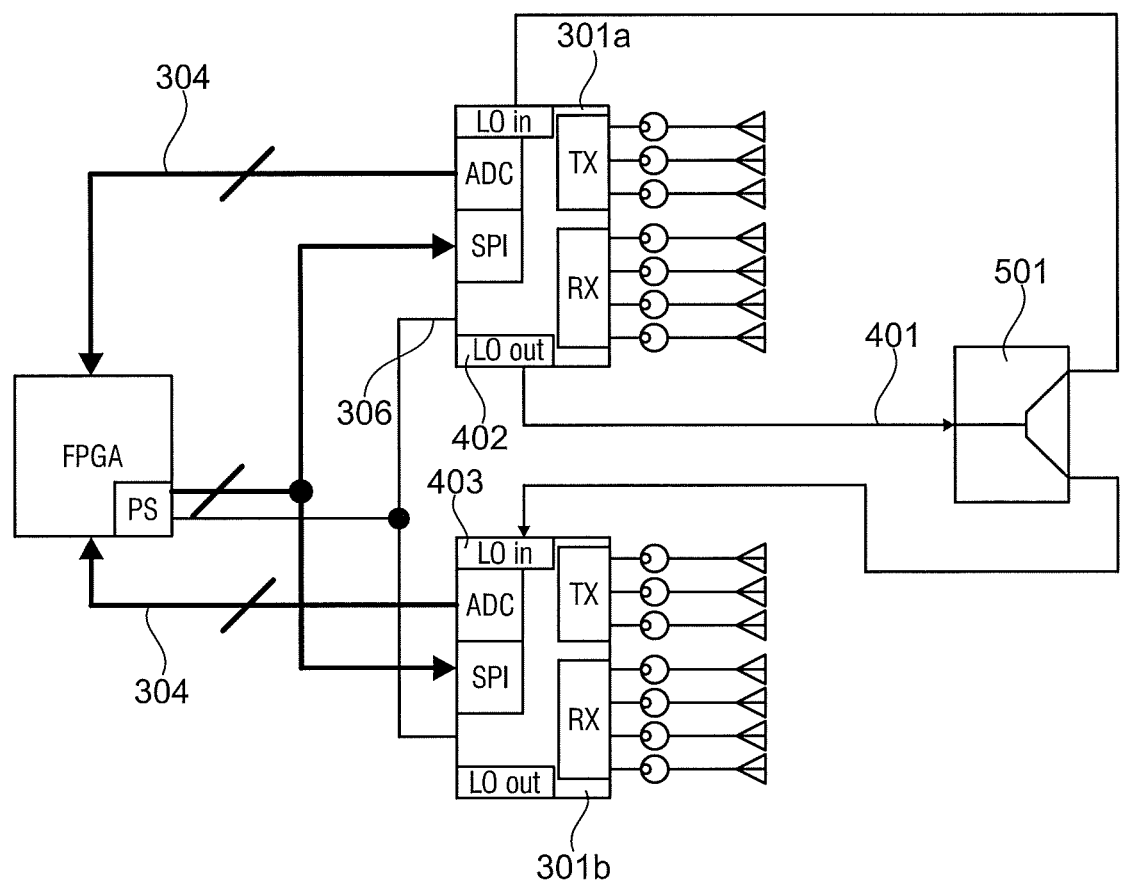
FIG. 4B shows the structure of a further radar level measurement device.

In the event of the radar chip 301 nonetheless providing too few transmit and receive channels 307, 308 (FIG. 3) for the desired application, said chips 301 offer the possibility of cascading. This means that a plurality of chips is combined to form a synchronised radar unit. It is thus possible for transmitters to transmit simultaneously, using a synchronous signal, and/or for receivers to receive synchronously, although said transmitters and/or receivers are physically located on different RSoCs.

This is made possible in that, in addition to various clock synchronisation lines, a radio-frequency signal is also distributed on a radio-frequency line assembly 401, proceeding from a synchronisation circuit 402 of a first chip 301a, to the synchronisation circuits 403 of other chips 301b. The radio-frequency signal is referred to as the local oscillator signal (LO signal) and, in terms of the frequency range, is a signal that is divided by a whole-number factor with respect to the transmission frequency range. The dividing factors of two or four, but also other whole-number dividing factors, are possible. If the radar chip has a transmission frequency range of approximately 80 GHz, for example, the LO-signal may thus have a frequency range of approximately 20 GHz or 40 GHz.

The chip which provides the radio-frequency signal is referred to as the master 301a. The chips that receive the radio-frequency signal are referred to as slaves 301b.

For example, a cascaded radar system containing four radar chips (FIG. 5), which in turn each comprise four receive channels, comprises sixteen digital interfaces by means of which the associated intermediate frequency signals (measurement data) are transmitted.

In order to process said digital measurement data, the radar chips usually use specially adjusted signal processors which, however, have a strictly limited number of digital interfaces. Units for digital signal processing may be integrated on the radar chip itself, although this is of only limited use, or cannot be used at all, for cascading radar chips and in the context of radar-based, topology-determining level measurement.

As a result, in order to overcome this problem, it is proposed to use an FPGA component 310 (FPGA: field programmable gate array) (FIGS. 3, 4A, 4B and 5) instead of the specially adjusted signal processor. Said universal components may be provided in various embodiments. The FPGA receives the digitised values of the intermediate frequency signal and undertakes arithmetic operations such as averaging, windowing or the calculation of FFTs (fast Fourier transform).

The combination of radar chips and the FPGA is advantageous in that it allows for a flexible combination of eight or more radar chips. Cascading such a large number of radar chips makes this technology of interest in the field of level measuring technology.

If a far larger number of radar chips is required, it is possible to also use more FPGAs and to then also mutually synchronise said FPGAs.

The FPGA advantageously contains, in addition to the programmable logic cells, an integrated processor system (PS) that can assume control tasks, such as parametrisation of the radar chips, energy management, actuation of a display, or communication with a computer or a process control point via a network. The processor system can also signal the start of a measurement via a digital line 306.

The processor system may furthermore assume signal processing tasks such as are known from existing level radar measurement devices, for example echo searching, suppression of spurious echoes, etc.

Depending on the type of the radar chip and of the FPGA, it may be necessary to carry out level adjustment of the digital interfaces. A specially adapted resistance network or an adjustment chip may be used for this purpose.

Since the digital interfaces, via which the digitised IF signal is transmitted, usually consist of one differential wire pair per channel, discrete line terminating resistors have to be provided, depending on the FPGA. Said resistors are usually 100 Ohm.

A further component that can advantageously be used is an amplifier (or a plurality thereof) comprising an integrated splitter for low-frequency signals which, proceeding from the master, signal the start of a measurement. The master emits said signal and distributes it to all the slaves. It is important in this case that the lines should be of approximately the same length, in order that there are no time offsets in the individual radar chips.

Figure 11:
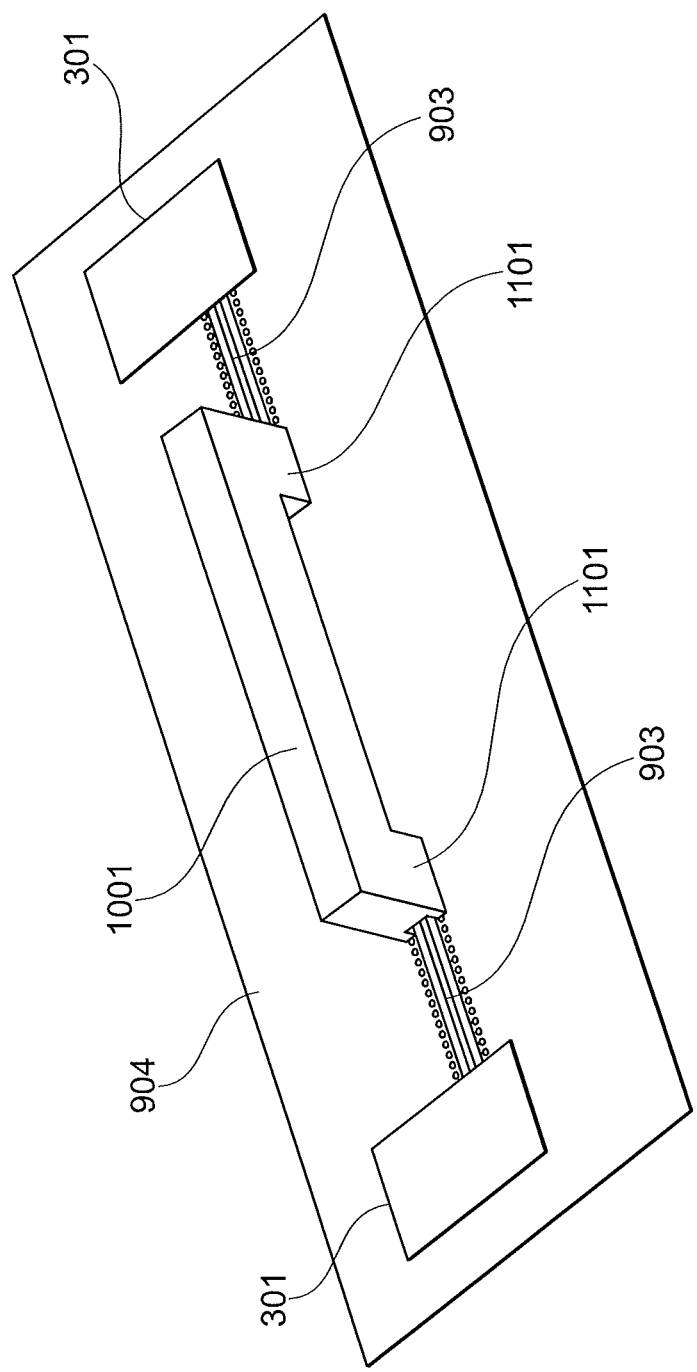
FIG. 11 shows a further radio-frequency line assembly comprising a waveguide.
Figure 12:
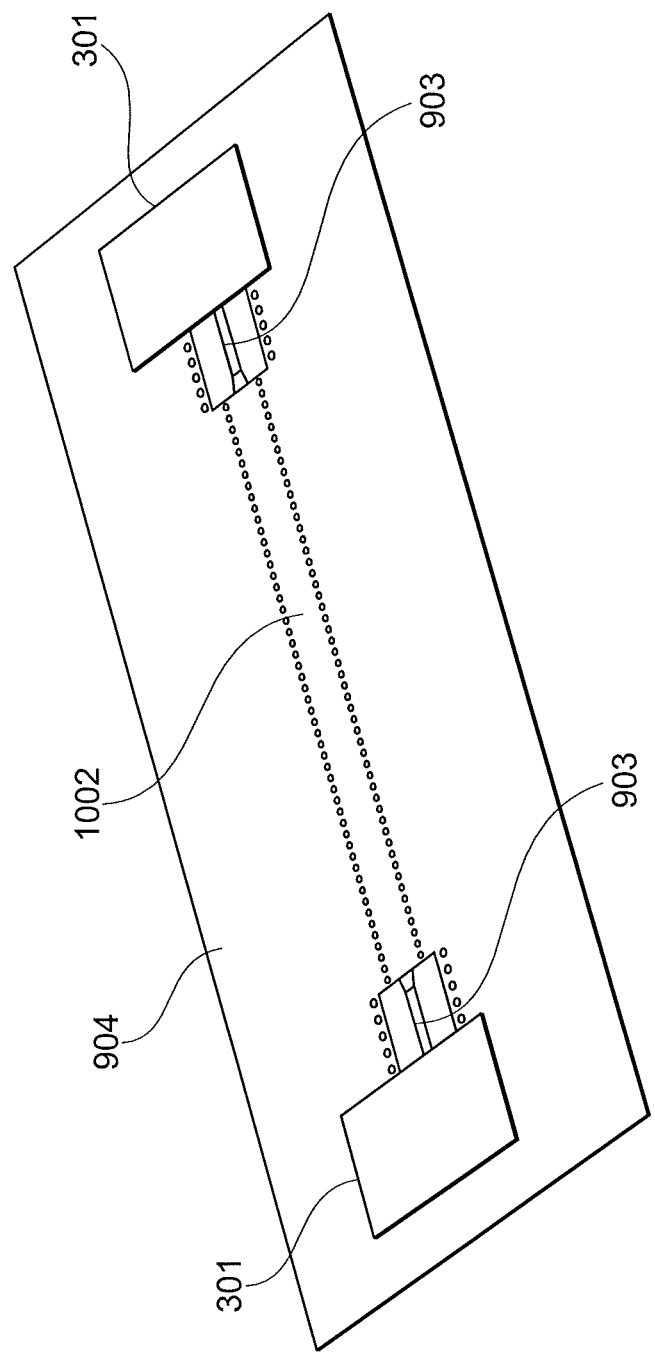
FIG. 12 shows a further radio-frequency line assembly.

Since a relatively large number of radar chips can be cascaded in this manner, it may be the case that the output stage of the LO signal does not deliver sufficient output power for operating all the radar chips. A problem when distributing the LO signal on the radio-frequency line 401 is that radio-frequency lines exhibit not insignificant path loss. Since the radar chips 301 on the printed circuit board 904 are usually spatially mutually separated by several centimetres (order of magnitude: 5-10 cm), the radio-frequency lines 401 which route the LO signal usually have to also be at least this length. A typical microstrip line on standard radio-frequency substrate may exhibit a loss of 0.5 to 2 dB/cm. This is dependent mainly on the substrate and the frequency. Waveguides, in contrast, can be constructed so as to have a far smaller path loss. For this reason, it is expedient to couple the signal into a waveguide, after the LO signal has been coupled out on the printed circuit board 904 by means of a microstrip line, in order that smaller losses are experienced on the path to the adjacent chip (shown schematically in FIG. 11).

Figure 6:
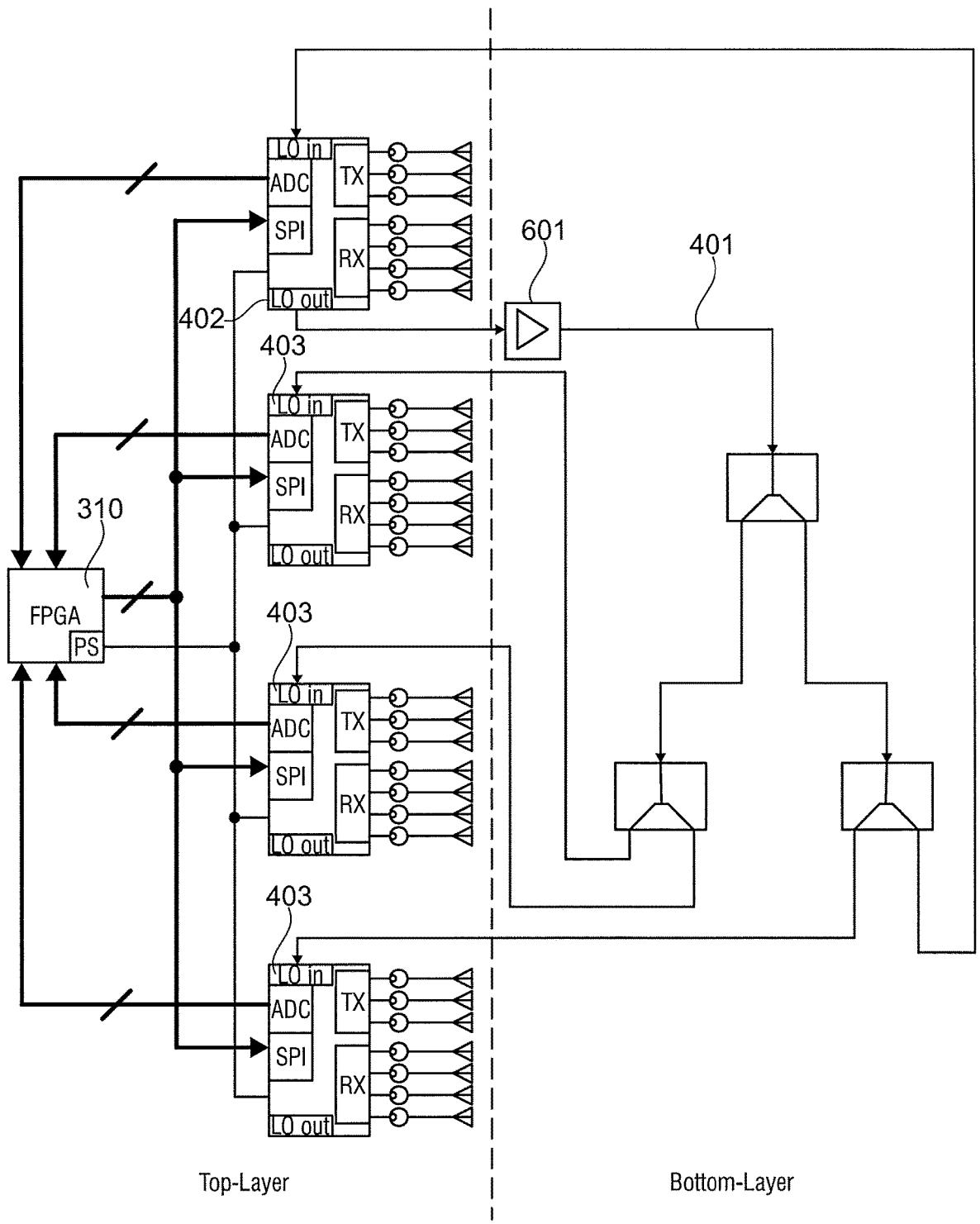
FIG. 6 shows the structure of a further radar level measurement device.
Figure 7:
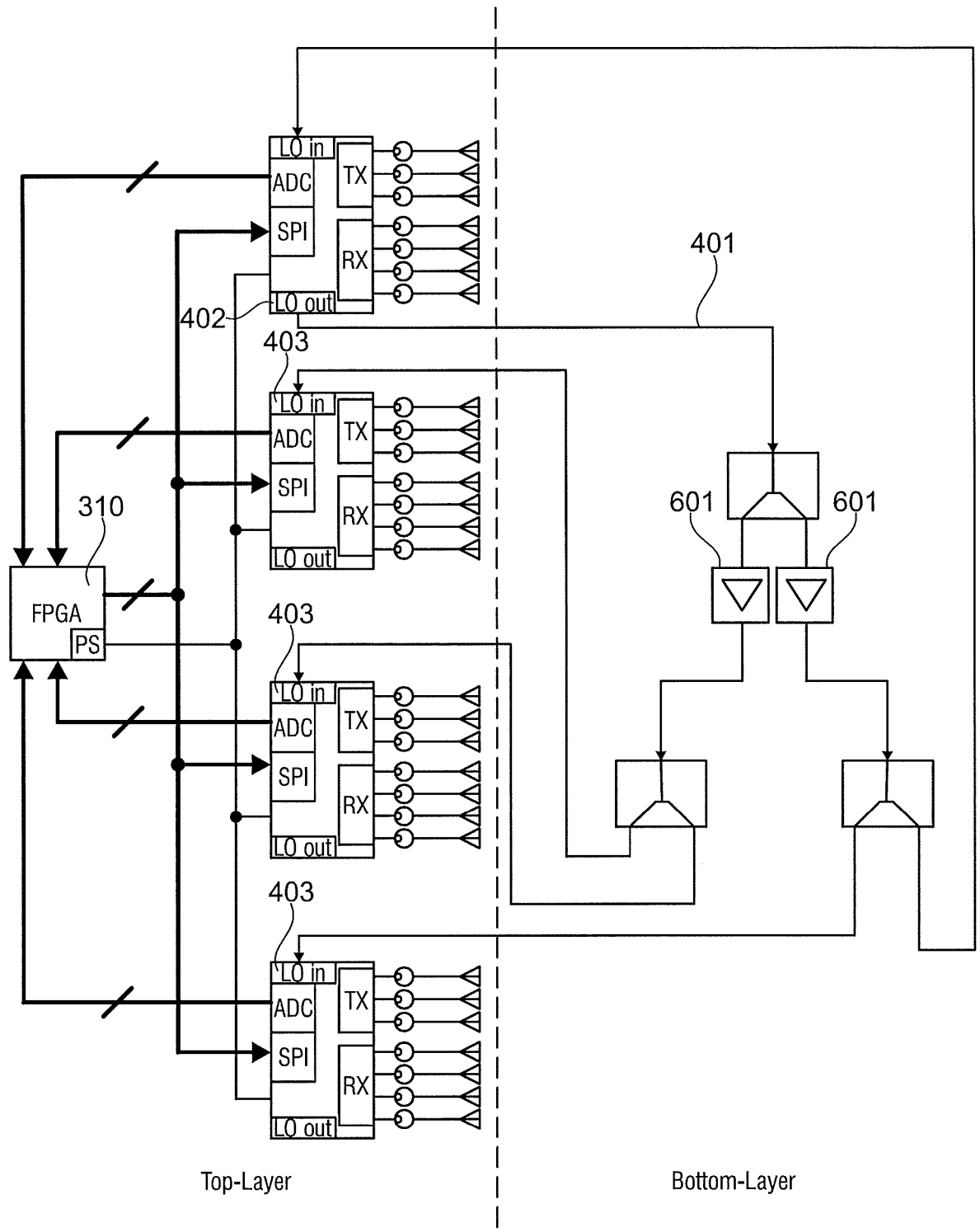
FIG. 7 shows the structure of a further radar level measurement device.

A further option is to use one or more external radio-frequency amplifiers 601 in order to amplify the RF power of the LO signal on the radio-frequency line 401 (FIGS. 6 and 7). Said amplifiers advantageously have a low noise figure, because said figure has a direct effect on the system performance. As a result, low noise amplifiers (LNAs) are proposed for this purpose. Said LNAs are active components comprising a separate voltage supply.

Advantageously, said LNAs are turned off between the radar frames and/or during transmission intermissions in order to save energy and to prevent the device from becoming too hot.

Furthermore, it must be ensured that the LNAs are operated in the linear range thereof, i.e. that the input power of the radio-frequency signal is not too great. If this is the case, signal distortions may occur. Owing to the technology, at 80 GHz typical output powers of semiconductor components are between 8 and 15 dBm without substantial signal distortions occurring.

If a radio-frequency signal having a power of 15 dBm is fed to a radio-frequency amplifier 601 having 20 dB gain, an output power of 35 dBm would theoretically result. However, since the radio-frequency amplifier 601 would then no longer be operating in the linear range thereof, undesired signal distortions would result. Therefore, the LO signal must first be brought into a power range such that the radio-frequency amplifier 601 can operate in the linear range thereof.

It is possible to parameterise, and thus attenuate, the LO output power of the radar chips 301. Likewise, a long radio-frequency line can also attenuate the output power.

It is possible that the radio-frequency amplifier may be usable only after the LO signal has been divided, and thus reduced in power, by means of a radio-frequency power divider. This is the case if a plurality of slaves 301b are used, or if, depending on the radar chip 301, the LO signal has to be returned again to the master 301a.

A plurality of amplifiers may be used, as can be seen in FIG. 7. Since an amplifier also has a finite signal processing time, the amplifiers are advantageously positioned such that substantially the same signal propagation delay is established on all the lines.

Since the LO signal is a radio-frequency signal, it is advantageous for waveguides, microstrip conductors 903 and/or SIWs (substrate integrated waveguides) 1002 (FIG. 10) to be used. Likewise, for splitting the line, power dividers 501 (e.g. Wilkinson dividers) and/or couplers 501 (e.g. rat-race couplers or Magic T 1401) are advantageously used.

Figure 5:
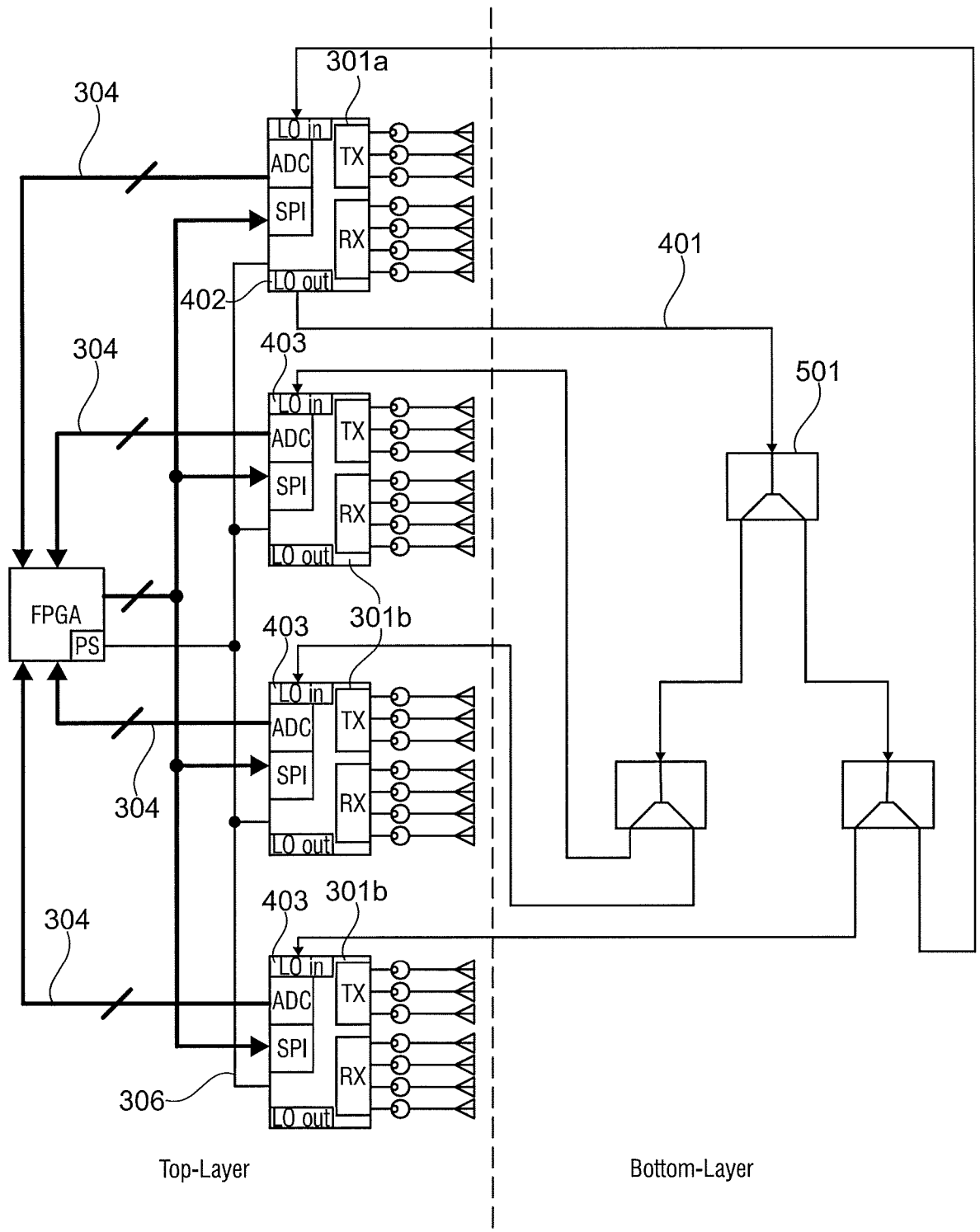
FIG. 5 shows the structure of a further radar level measurement device.
Figure 13A:
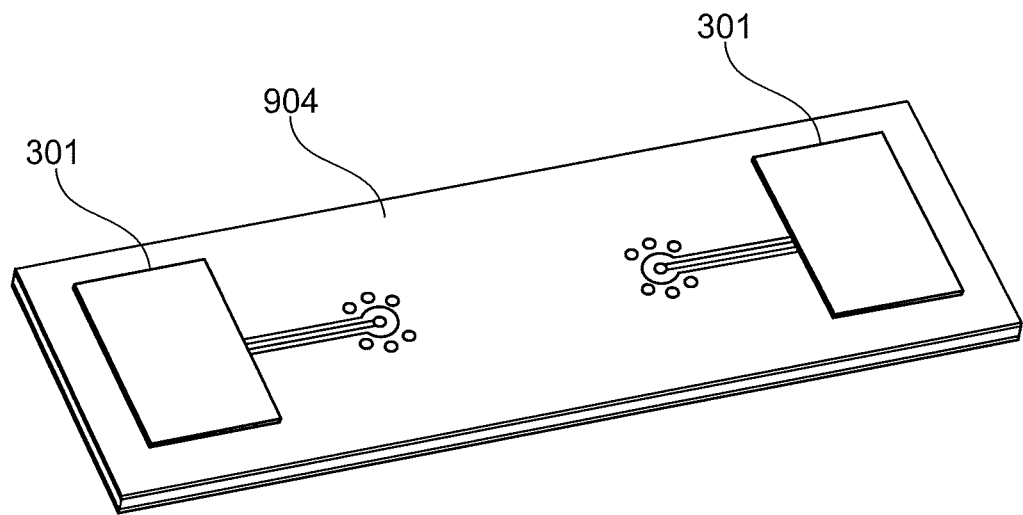
FIG. 13A is a plan view of a further radio-frequency line assembly.
Figure 13B:
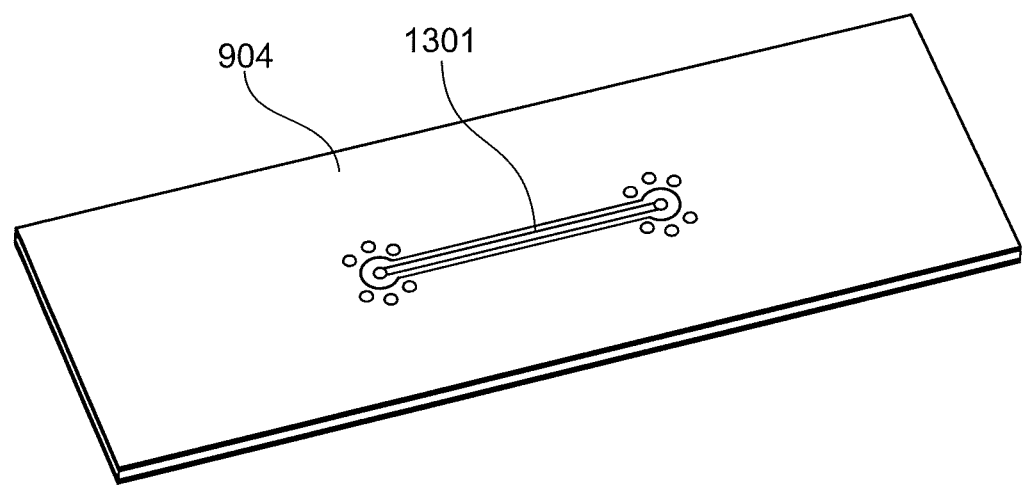
FIG. 13B shows the lower face of a printed circuit board of the line assembly of FIG. 13A.

The radar chips are advantageously positioned on one side of the printed circuit board 904, and the splitting and distribution of the LO signal takes place on the other side of the printed circuit board 904, as shown in FIGS. 5 to 7 and also in FIGS. 13a and 13b. The reasons for this will be explained in the following. The radar chips usually comprise nine or ten signal inputs and signal outputs, the frequency range thereof is in the two-digit gigahertz range. When cascading the radar chips, it is necessary to also route the LO signals from chip to chip, in addition to the lines to the transmitting and receiving antennas. This plurality of signal lines means that intersections of signals are often unavoidable.

Figure 8:
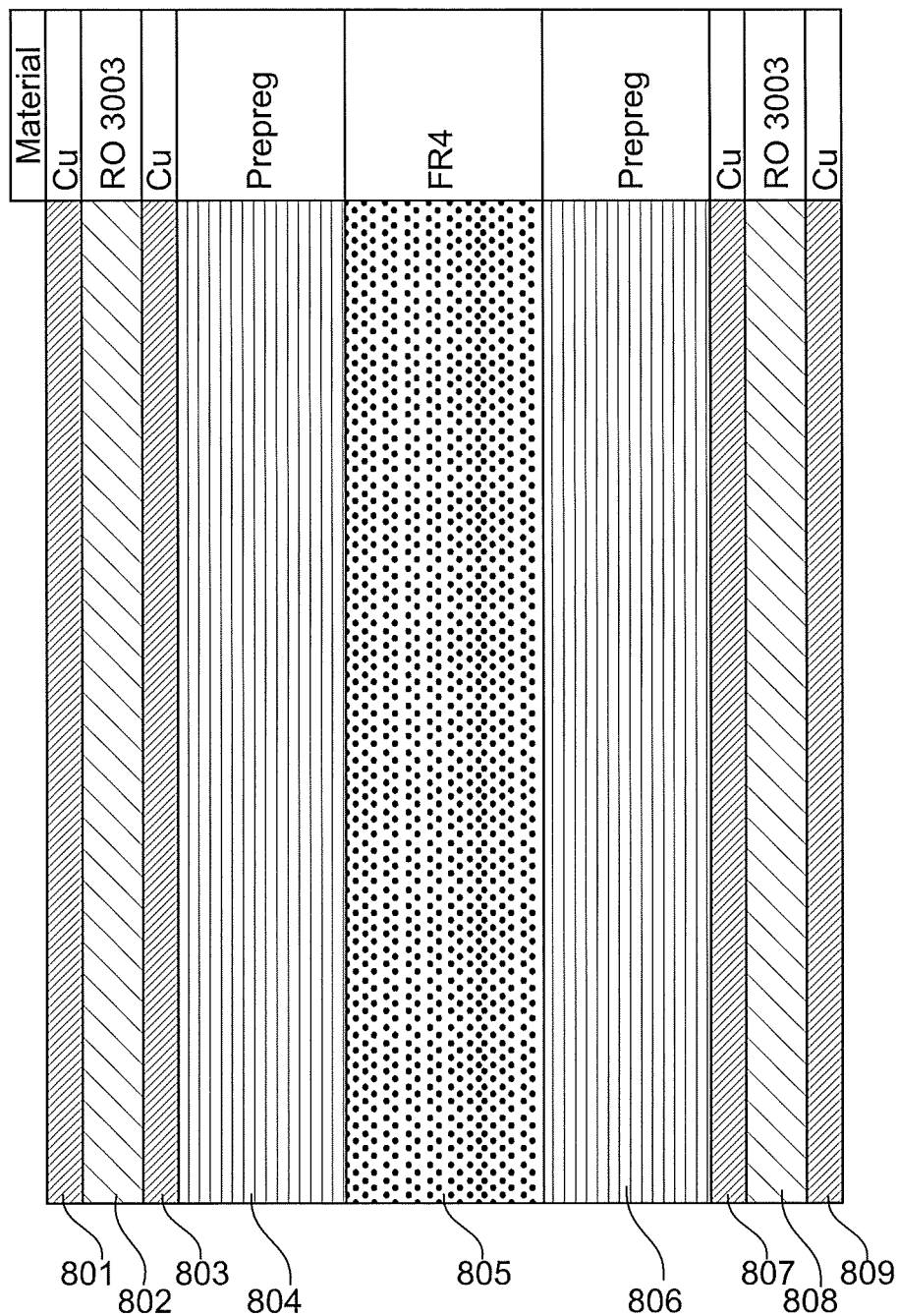
FIG. 8 shows a printed circuit board layer structure.

However, since it is not possible for signal lines to intersect on a printed circuit board 904, the signals are usually guided by means of vias, into other internal printed circuit board planes (inner layers) 803, 807, and routed past one another there. FIG. 8 shows a typical printed circuit board layer structure, a plurality of substrates being bonded together by means of an adhesive film 804, 806. However, the inner layers of printed circuit boards 904 are usually standard substrate materials 804, 805, 806 and are not suitable for radio-frequency signals. In particular, for reasons of cost and stability, often only one or both of the outermost substrate layers 802, 808 of a printed circuit board 904 are constructed of special substrate material that is optimised for radio-frequency technology (for example Rogers RO3003). Radio-frequency substrates are generally supple and have to be formed so as to be very thin in the case of high frequencies, e.g. 127 µm.

Figure 9A:
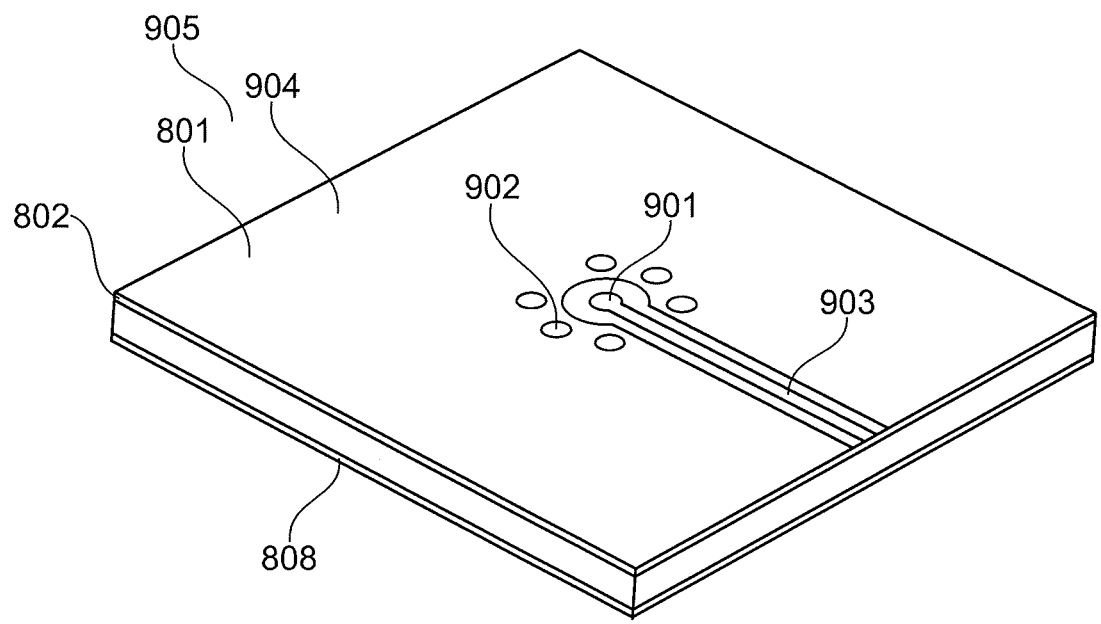
FIG. 9A shows a via assembly of a radar level measurement device.
Figure 9B:
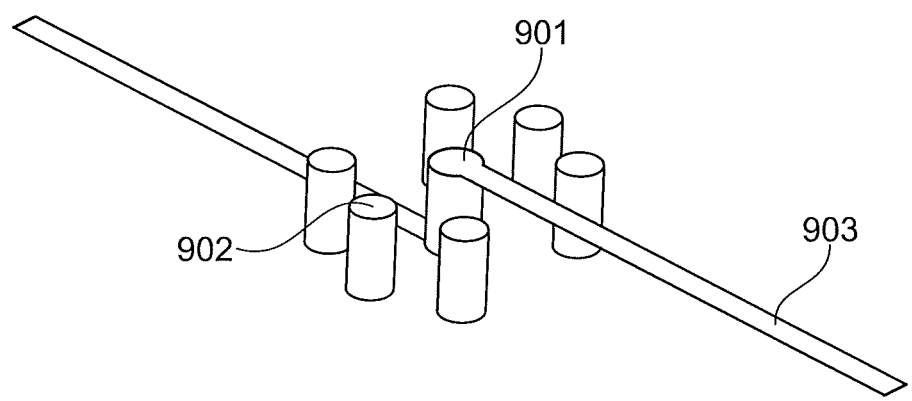
FIG. 9B shows the metallised elements of the via assembly of FIG. 9A.

For these reasons, it is proposed to route the LO signal from the chip-side printed circuit board plane to the rear side, by means of special line structures and via assemblies, to split, optionally amplify and distribute said signal there, and return it to the chip-side printed circuit board plane. Special line structures and via assemblies of this kind can be seen in FIGS. 9A and 9B (FIG. 9B shows the line and vias without the substrate materials and copper surfaces). In this case, further auxiliary vias 902 are positioned at a constant radius around the main via 901 and thus form a type of coaxial circuit board feedthrough. The via diameter and the spacing from the main via substantially determine the impedance of the feedthrough and have to be adjusted to the frequency range used, which is for example 40 GHz.

An alternative option for routing the LO signals without intersection of the lines is that of coupling the signal into a waveguide or a coaxial cable and to construct the waveguide or coaxial cable such that the lines are guided past one another. In order to bring about coupling into a waveguide, for example, a transition from the microstrip line to the waveguide 1101 may be used.

Figure 10A:
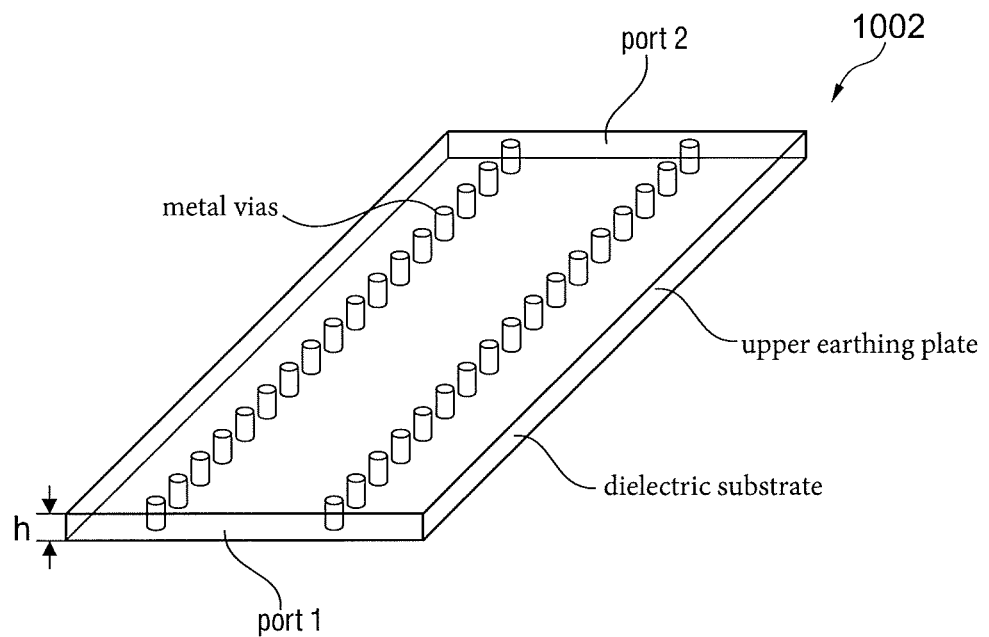
FIG. 10A shows a detail of a radio-frequency line assembly.

Another useful line type is the substrate integrated waveguide (SIW) (FIG. 10A). Said line type is advantageously used if, for example, a waveguide (1001) is not resting directly on a circuit board/printed circuit board (904) on which a LO/RF signal has to be routed through, by means of a microstrip line, under the waveguide. Since the waveguide usually consists of metal, it would short-circuit the microstrip line, making signal transmission impossible. The SIW is advantageous in this case, because said SIW comprises a pure metal surface on the printed circuit board surface, and it does not matter whether a waveguide is positioned thereover (see FIG. 10C).

Figure 10B:
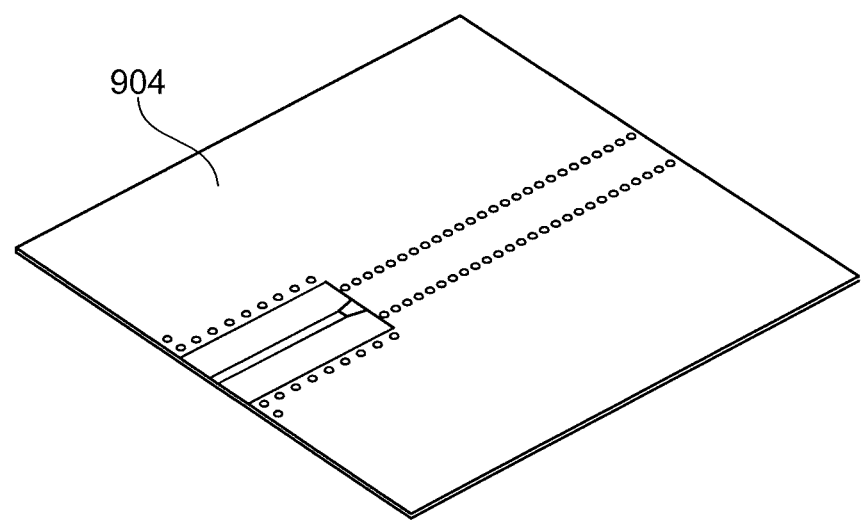
FIG. 10B shows a detail of a further radio-frequency line assembly.
Figure 10C:
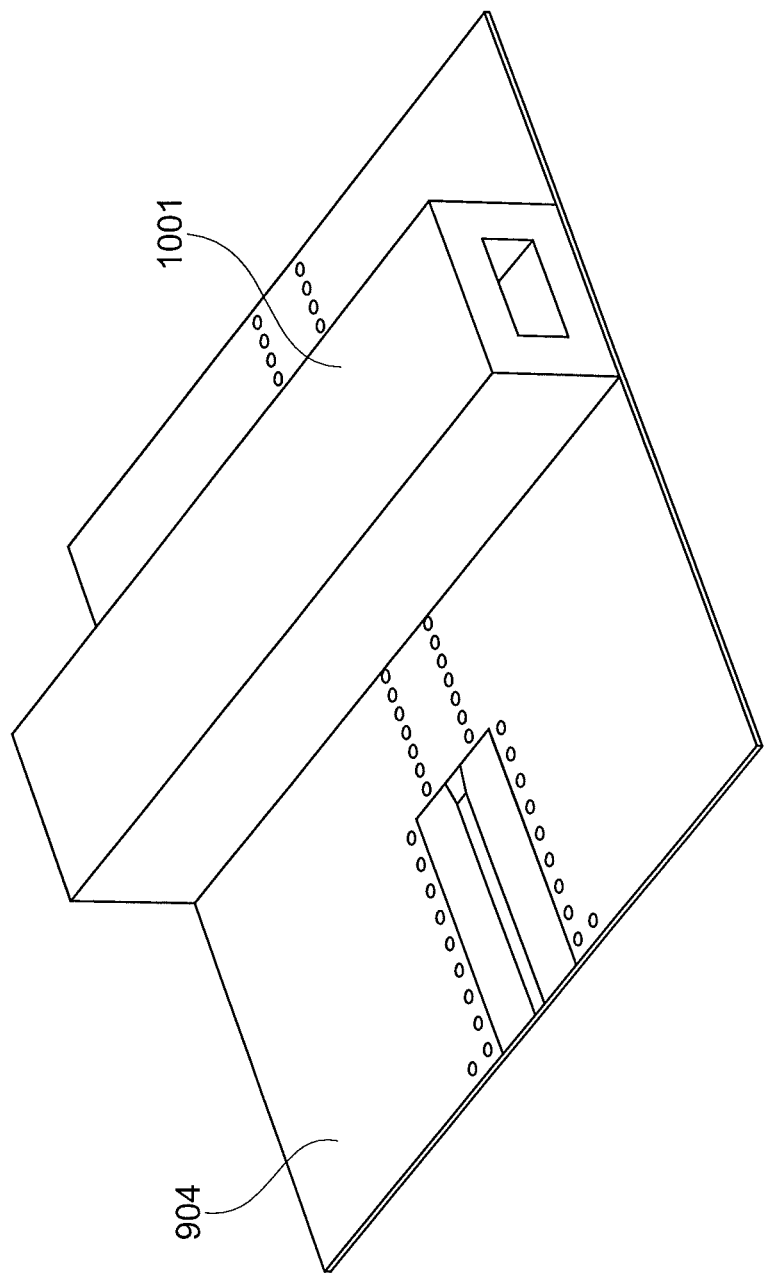
FIG. 10C shows a detail of a further radio-frequency line assembly.

FIG. 10B shows a transition from microstrip line technology to SIW.

Subsequently, the signal has to be coupled into a microstrip line on the printed circuit board (904) again, in order to be able to be routed into the radar chip.

Robust antenna equipment, which continues to function in harsh process conditions such as high and low pressures, high and low temperatures, dirt, dust, moisture, mist, etc., is characteristic of radar level measurement devices. In addition, the antennas also have to protect the electronics from the above-mentioned influences and are often constructed so as to also comply with safety-critical aspects such as explosion protection.

Said property can thus also be implemented in topology-determining radar level measurement devices. Unlike in the case of radar devices in the automotive industry, in which requirements of this kind are not as high, process measuring technology often makes use of waveguides and horn radiators.

Furthermore, it is advantageous, in the case of systems for digital beamforming, for one or more antenna elements to have a spacing of <λ/2, in which λ denotes the wavelength of the transmission signal. For cases of this kind, it is necessary to use special waveguide couplings 302 in order to couple the signal from a circuit board into a (horn) antenna 303.

A further problem of topology-determining radar level measurement devices comprising cascaded radar chips is that the above-described antennas may be arranged only in specified patterns. An advantageous pattern would be a T-shaped or L-shaped arrangement of the antenna elements. In order to prevent long line lengths in the case of the radio-frequency signals, it is proposed to position the radar chips on the upper and lower face of the printed circuit board in order for the line lengths from the radar chip to the waveguide coupling to be approximately the same for all the RF signals.

A basic concept of the invention can be considered to be that of providing a radar level measurement device 101 that determines the topology of the filling material surface, which radar level measurement device consists of or at least comprises a plurality of integrated radar chips 301, the radar chips 301 being mutually synchronised using a radio-frequency signal (local oscillator signal) that is generated by one radar chip 301a and routed on a radio-frequency line 401, and the local oscillator signal being transmitted by at least one further line type in addition to lines of the microstrip line type 903.

Figure 14A:
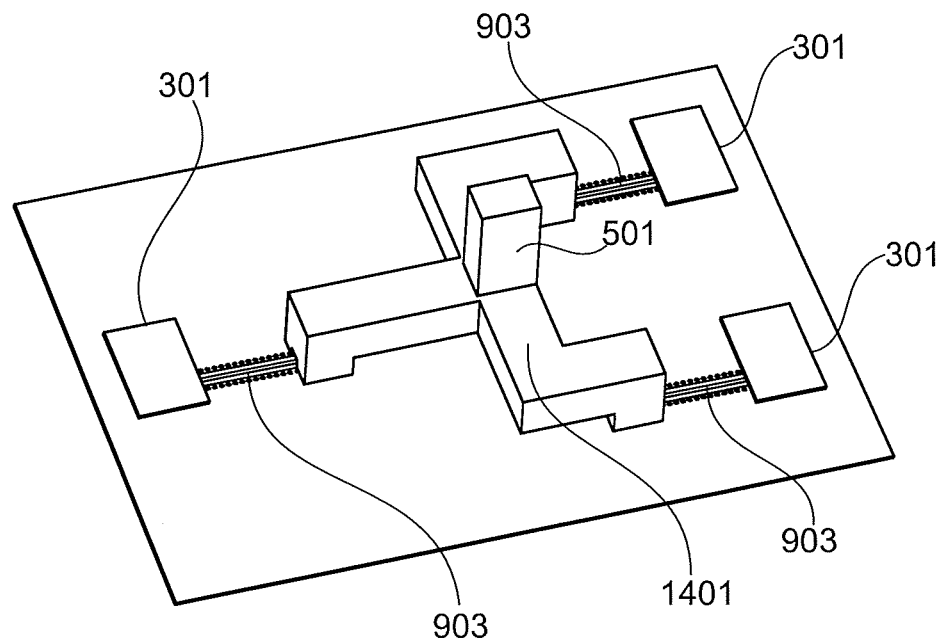
FIG. 14A shows a further radio-frequency line assembly comprising a waveguide and a power divider.

FIG. 14A shows a radio-frequency line assembly that routes the radio-frequency signal from the first synchronisation circuit 402 (cf. FIG. 5) of the first radar chip to the corresponding synchronisation circuits 403 of the slave chips, such that the master chip can synchronise the slave chips.

The printed circuit board-bound line 903 leads into a waveguide coupling, such that the radio-frequency signal can thereafter be routed further by the waveguide 1401. A radio-frequency power divider 501 is provided in the waveguide 1401, which power divider divides the radio-frequency signal onto two waveguides which then each lead into a printed circuit board-bound radio-frequency line 903 that forwards the radio-frequency signal to the relevant radar chip.

Figure 14B:
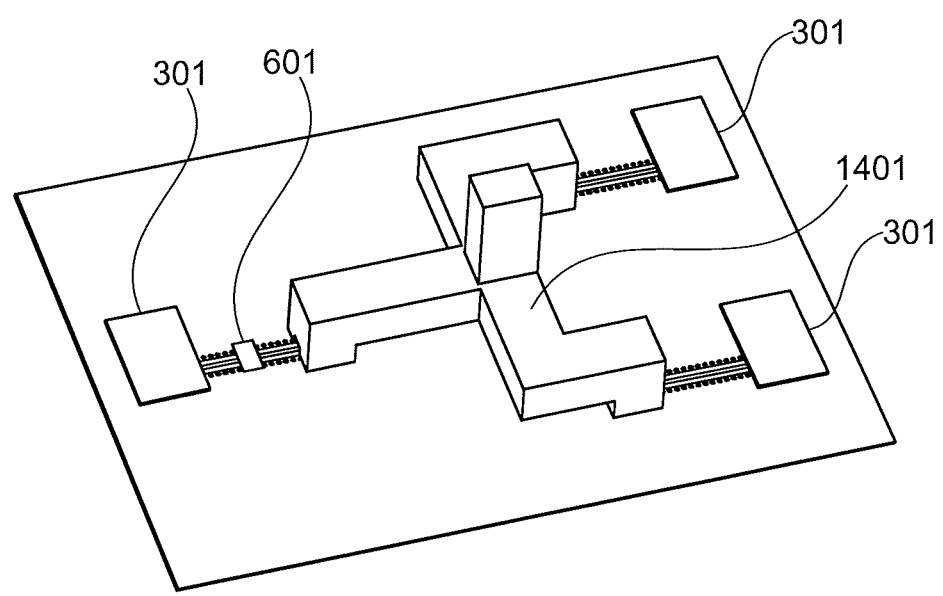
FIG. 14B shows a further radio-frequency line assembly comprising a waveguide, a power divider and an amplifier.

In contrast with FIG. 14A, in the embodiment according to FIG. 14B a radio-frequency amplifier 601 is provided in the first printed circuit board-bound line, in order to amplify the radio-frequency signal before it is coupled into the waveguide 1401.

Figure 15A:
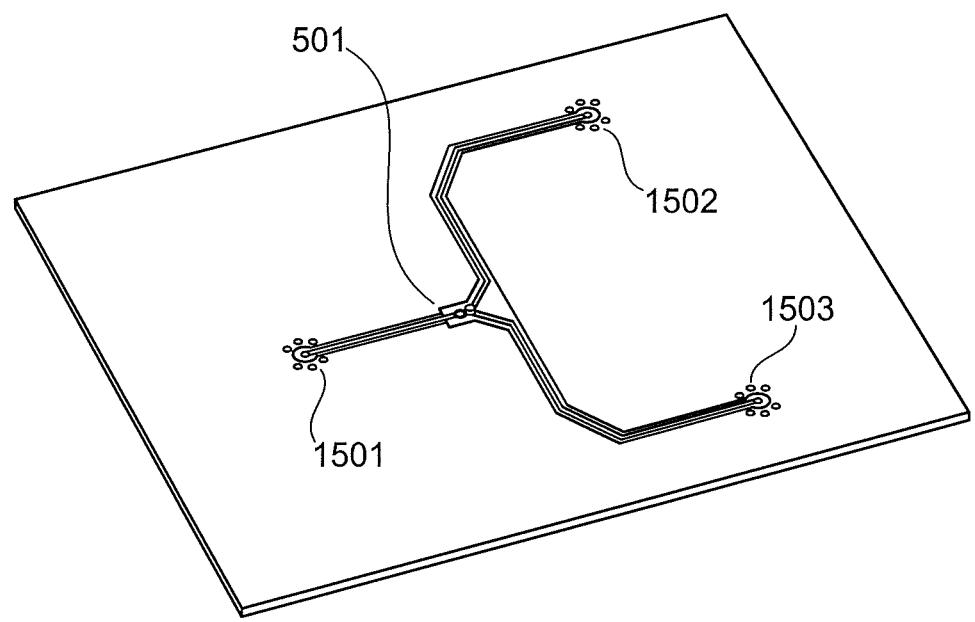
FIG. 15A shows a further radio-frequency line assembly comprising a power divider.

FIG. 15A shows a further embodiment of a radio-frequency line assembly on the upper face of the printed circuit board, comprising a power divider 501. The starting point 1501 and the end points 1502, 1503 each comprise a via, as is shown in greater detail in FIGS. 9A and 9B.

Figure 15B:
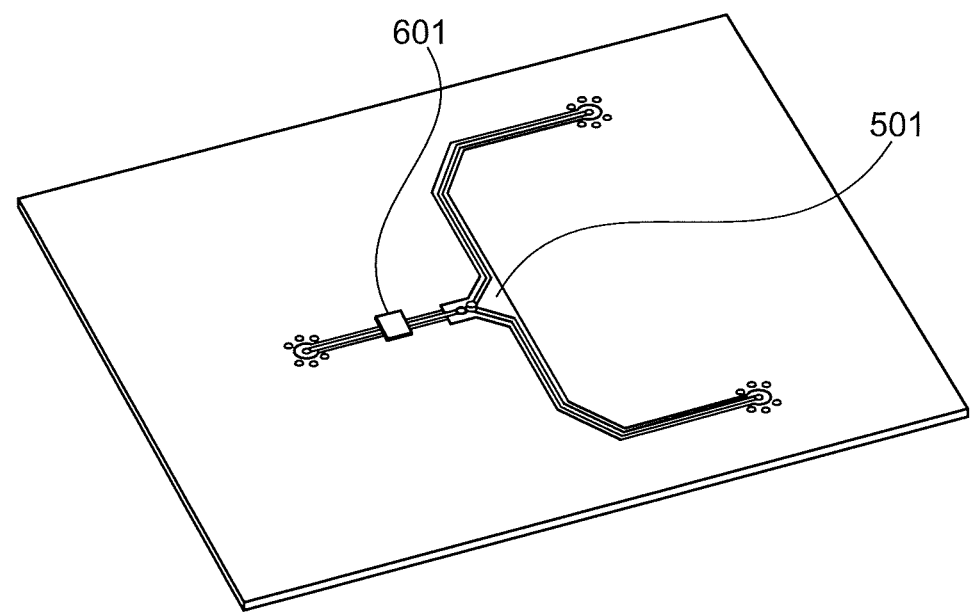
FIG. 15B shows a further radio-frequency line assembly comprising a waveguide, a power divider and an amplifier.

FIG. 15B corresponds to the embodiment of FIG. 15A and furthermore comprises an amplifier 601 upstream of the power divider 501.

Figure 15C:
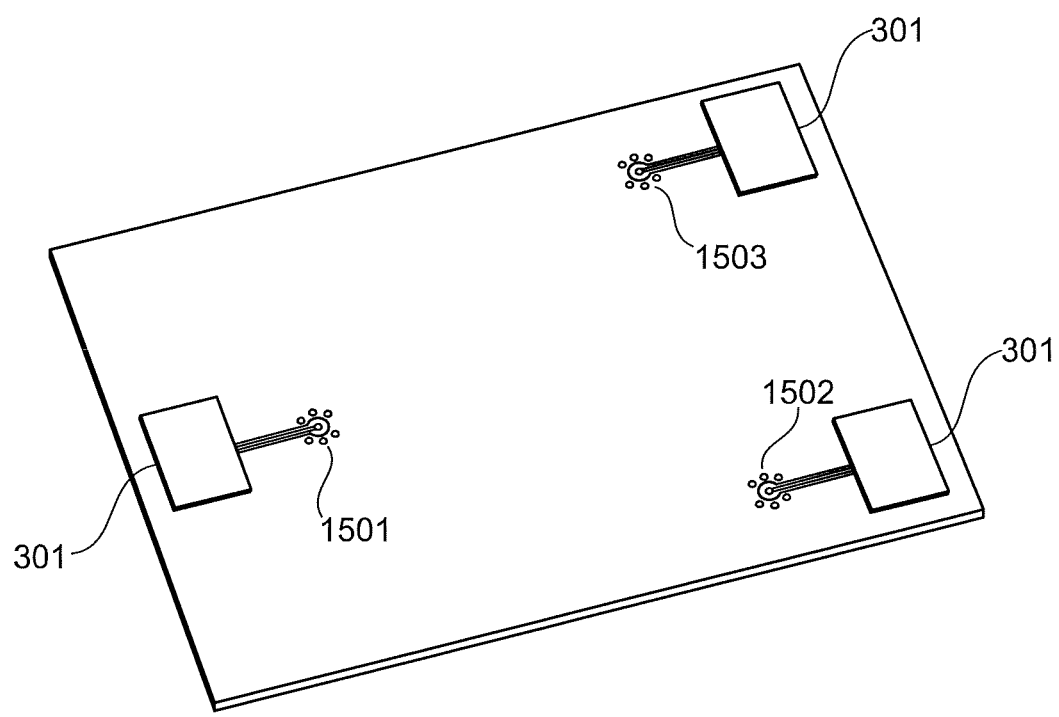
FIG. 15C shows the lower face of the radio-frequency line assemblies of FIG. 15A and FIG. 15B.

FIG. 15C shows the lower face of the printed circuit boards of FIGS. 15A and 15B, showing the radar chips 301 and lines connected to the other synchronisation circuits, which lead into the vias shown in FIGS. 15A and B.

In addition, it should be noted that "comprising" and "having" do not exclude any other elements or steps, and the indefinite article "a" or "an" does not exclude a plurality. It should furthermore be noted that features or steps that have been described with reference to one of the above embodiments can also be used in combination with other features or steps or other embodiments described above. Reference signs in the claims should not be considered limiting.

The invention claimed is:

1. A radar level measurement device for level measurement or for determining a topology of a filling material surface in a container, comprising:
    a first radar chip and a second radar chip,
        wherein the first radar chip comprises a first synchronisation circuit configured to generate a radio-frequency signal, and
        wherein the second radar chip comprises a second synchronisation circuit; and
    a radio-frequency line assembly configured to transmit the radio-frequency signal from the first synchronisation circuit to the second synchronisation circuit to synchronise the first and the second radar chips,
    wherein the radio-frequency line assembly comprises two or more different line types, comprising a microstrip line and a waveguide, arranged in series with one another.

2. The radar level measurement device according to claim 1,
    wherein the waveguide is either a rectangular waveguide or a circular waveguide, a coaxial conductor, the waveguide is integrated in a substrate, and/or is a coplanar waveguide.

3. The radar level measurement device according to claim 1,
    wherein the radio-frequency line assembly further comprises a waveguide coupling configured to couple the radio-frequency signal from a first line type into the waveguide.

4. The radar level measurement device according to claim 1,
    wherein the radio-frequency line assembly is split using a radio-frequency power divider to synchronise a plurality of radar chips.

5. The radar level measurement device according to claim 4,
    wherein two lines that proceed from the radio-frequency power divider have a same signal propagation delay until a split radio-frequency signal reaches the synchronisation circuit of the corresponding radar chip.

6. The radar level measurement device according to claim 1,
    further comprising a radio-frequency amplifier arranged in the radio-frequency line assembly and being configured to amplify the radio-frequency signal.

7. The radar level measurement device according to claim 6,
    wherein the radio-frequency amplifier has a useful frequency range of over 30 GHz.

8. The radar level measurement device according to claim 1,
    wherein the radio-frequency signal is a radio-frequency signal that is divided by a whole-number factor with respect to a transmission signal.

9. The radar level measurement device according to claim 1,
    wherein an analogue-to-digital converter is integrated on each of the first radar chip and the second radar chip.

10. The radar level measurement device according to claim 1,
    wherein the radio-frequency line assembly further comprises a first conductive track on a printed circuit board, a second conductive track on the printed circuit board, and the waveguide is arranged therebetween.

11. The radar level measurement device according to claim 1,
    wherein the device is configured to determine a topology of a medium in the container.

12. The radar level measurement device according to claim 1,
    wherein the first radar chip and the second radar chip each comprise one or more transmit channels each being configured to emit a transmission signal, and one or more receive channels each being configured to receive a transmission signal that is reflected from the filling material surface.

13. The radar level measurement device according to claim 1,
    wherein the device is configured as a frequency-modulated continuous-wave (FMCW) level measurement device.

* * * * *